US012648389B2

(12) United States Patent
Bamford

(10) Patent No.: US 12,648,389 B2
(45) Date of Patent: Jun. 2, 2026

(54) COMPACT MODULAR GAS DISTRIBUTION PLUMBING AND HEATING SYSTEM FOR MULTI-STATION DEPOSITION MODULES

(71) Applicant: LAM RESEARCH CORPORATION, Fremont, CA (US)

(72) Inventor: Thadeous Bamford, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 700 days.

(21) Appl. No.: 18/027,288

(22) PCT Filed: Sep. 24, 2021

(86) PCT No.: PCT/US2021/051920
§ 371 (c)(1),
(2) Date: Mar. 20, 2023

(87) PCT Pub. No.: WO2022/067016
PCT Pub. Date: Mar. 31, 2022

(65) Prior Publication Data
US 2023/0377908 A1 Nov. 23, 2023

Related U.S. Application Data

(60) Provisional application No. 63/084,537, filed on Sep. 28, 2020.

(51) Int. Cl.
*H01L 21/67* (2006.01)
*C23C 16/455* (2006.01)

(52) U.S. Cl.
CPC .. *H01L 21/67017* (2013.01); *C23C 16/45544* (2013.01); *C23C 16/45561* (2013.01); *H01L 21/67248* (2013.01)

(58) Field of Classification Search
CPC ............ C23C 16/455; C23C 16/45561; C23C 16/45544; C23C 16/505; C23C 16/52;
(Continued)

(56) References Cited

U.S. PATENT DOCUMENTS 7,918,938 B2 * 4/2011 Provencher ....... C23C 16/45565
156/345.33
8,746,284 B2 * 6/2014 DeDontney ....... C23C 16/45561
137/884
(Continued)

FOREIGN PATENT DOCUMENTS

| JP | 2018014479 A | 1/2018 |
| TW | 201634735 A | 10/2016 |
| WO | WO-9821744 A2 | 5/1998 |

OTHER PUBLICATIONS

International Search Report and Written Opinion of the ISA issued in PCT/US2021/051920, mailed Jan. 5, 2022; ISA/KR.
(Continued)

*Primary Examiner* — Brian P Wolcott

(57) ABSTRACT

A gas distribution arrangement to provide gas mixtures to processing stations in a substrate processing system comprises a first and second valve inlet blocks to supply first and second precursor gas mixtures. The first valve inlet block is arranged above the processing stations and comprises a first housing that encloses a first plurality of valves in fluid communication with the processing stations and a first precursor gas manifold, a first co-flow gas manifold, and a first divert outlet manifold in fluid communication with the first plurality of valves. The second valve inlet block is arranged above the first valve inlet block and comprises a second housing that encloses a second plurality of valves in fluid communication with the processing stations and a second precursor gas manifold, a second co-flow gas mani- (Continued)

fold, and a second divert outlet manifold in fluid communication with the second plurality of valves.

19 Claims, 6 Drawing Sheets

(58) Field of Classification Search
     CPC ......... H01L 21/67017; H01L 21/67248; H01L
                                                21/67103
     See application file for complete search history.

(56) References Cited

U.S. PATENT DOCUMENTS

| | | | | |
|---|---|---|---|---|
| 9,574,268 | B1 * | 2/2017 | Dunn | C23C 16/45512 |
| 9,970,108 | B2 * | 5/2018 | Qian | C23C 16/4481 |
| 10,665,430 | B2 | 5/2020 | Sawachi et al. | |
| 10,815,568 | B2 * | 10/2020 | Kabe | C23C 16/45561 |
| 12,424,414 | B2 * | 9/2025 | Chakravarthy ... | H01J 37/32743 |
| 2012/0289057 | A1 | 11/2012 | DeDontney | |
| 2016/0032453 | A1 | 2/2016 | Qian et al. | |
| 2017/0121818 | A1 | 5/2017 | Dunn et al. | |
| 2022/0228263 | A1 * | 7/2022 | Roberts | C23C 16/45536 |
| 2024/0093372 | A1 * | 3/2024 | Takasaki | C23C 16/4412 |
| 2024/0234167 | A1 * | 7/2024 | Sharma | H01L 21/67017 |
| 2024/0420969 | A1 * | 12/2024 | Miller | C23C 16/4408 |
| 2025/0198002 | A1 * | 6/2025 | Lee | C23C 16/45591 |

OTHER PUBLICATIONS

Office Action received for related TW App. No. 110135975 dated Mar. 31, 2025.

* cited by examiner

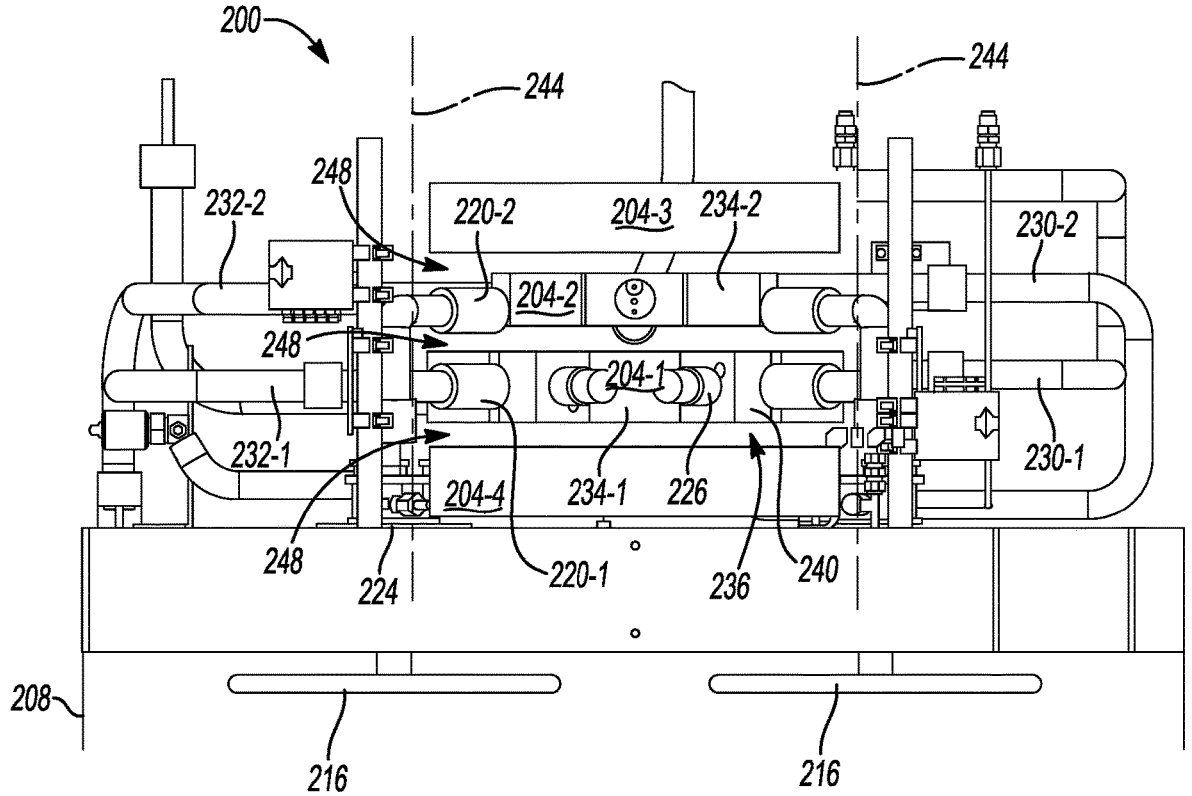
<u>FIG. 2D</u>

COMPACT MODULAR GAS DISTRIBUTION PLUMBING AND HEATING SYSTEM FOR MULTI-STATION DEPOSITION MODULES

CROSS-REFERENCE TO RELATED APPLICATIONS

This application is a U.S. National Phase Application under 35 U.S.C. 371 of International Application No. PCT/US2021/051920, filed on Sep. 24, 2021, which claims the benefit of U.S. Provisional Application No. 63/084,537, filed on Sep. 28, 2020. The entire disclosures of the applications referenced above are incorporated herein by reference.

FIELD

The present disclosure relates to gas delivery systems for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching typically comprise a processing chamber with a pedestal. A substrate such as a semiconductor wafer may be arranged on the pedestal during processing. A process gas mixture comprising one or more precursors may be introduced into the processing chamber to deposit film on the substrate or to etch the substrate. In some substrate processing systems, radio frequency (RF) plasma can be struck in the processing chamber and/or an RF bias on the pedestal may be used to activate chemical reactions.

Various gas flow paths in the gas delivery system are used to deliver process gases, carrier gases, oxidizing gases, precursor gases and/or purge gases to the processing chamber. The gas flow paths are defined by via tubing, valves, manifolds and gas flow channels in a valve inlet block.

SUMMARY

A gas distribution arrangement to provide gas mixtures to a plurality of processing stations in a substrate processing system comprises a first valve inlet block to supply a first precursor gas mixture to each of the plurality of processing stations. The first valve inlet block is arranged in a first vertical layer above the plurality of processing stations. The first valve inlet block comprises a first housing that encloses a first plurality of valves in fluid communication with respective ones of the plurality of processing stations, a first precursor gas manifold in fluid communication with each of the first plurality of valves, a first co-flow gas manifold in fluid communication with each of the first plurality of valves, and a first divert outlet manifold in fluid communication with each of the first plurality of valves.

The gas distribution arrangement comprises a second valve inlet block to supply a second precursor gas mixture to each of the plurality of processing stations. The second valve inlet block is arranged in a second vertical layer above the first valve inlet block. The second valve inlet block comprises a second housing that encloses a second plurality of valves in fluid communication with respective ones of the plurality of processing stations, a second precursor gas manifold in fluid communication with each of the second plurality of valves, a second co-flow gas manifold in fluid communication with each of the second plurality of valves, and a second divert outlet manifold in fluid communication with each of the second plurality of valves.

In other features, at least one of the first plurality of valves and the second plurality of valves comprises outlet/divert valves. A third valve inlet block is arranged in a third vertical layer above the second valve inlet block. The first housing of the first valve inlet block comprises a top portion and a bottom portion that defines a central cavity and a plurality of channels within the central cavity. The plurality of channels are arranged to enclose respective portions of each of the first plurality of valves, the first precursor gas manifold, the first co-flow gas manifold, and the first divert outlet manifold. The plurality of channels comprises a central hub and a plurality of arms that extend radially outward from the central hub. The plurality of arms comprises a first arm, a second arm, a third arm, and a fourth arm arranged in an "X" shape. The first arm, the second arm, the third arm, and the fourth arm enclose the first precursor gas manifold.

In other features, the plurality of arms comprise a fifth arm, a sixth arm, and a seventh arm arranged in a "T" shape. The fifth arm, the sixth arm, and the seventh arm enclose the first divert outlet manifold. A first precursor gas inlet is in fluid communication with the first precursor gas manifold and a first divert outlet is in fluid communication with the first divert outlet manifold. One of the fifth arm, the sixth arm, and the seventh arm encloses the first precursor gas inlet and another of the fifth arm, the sixth arm, and the seventh arm encloses the first divert outlet. A first co-flow gas inlet is in fluid communication with the first co-flow gas manifold. The top portion encloses the first co-flow gas inlet and the first co-flow gas manifold.

In other features, each corner of the first valve inlet block comprises legs that extend outward from the first housing to form a "V" shape and the legs define valve cavities to enclose the first plurality of valves. Each of the first valve inlet block and the second valve inlet block comprises a thermally conductive metal core. The core comprises aluminum. The metal core comprises a heater film bonded to an outer surface of the metal core. The heater film is bonded to the outer surface of the metal core with a thermal adhesive.

In other features, the gas distribution arrangement further comprises a controller configured to control supply of respective electrical signals to the heater films of the first valve inlet block and the second valve inlet block to separately control temperatures of the first valve inlet block and the second valve inlet block. Each of the heater films comprises a plurality of heater zones. Each of the first valve inlet block and the second valve inlet block has a height of less than 76.2 mm.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2D is a side view of an example gas distribution arrangement according to the present disclosure;

In the drawings, reference numbers may be reused to identify similar and/or identical elements.

DETAILED DESCRIPTION

A valve inlet block for a gas delivery system comprises an arrangement of tubing, valves, manifolds, and gas flow channels to supply gas mixtures to respective processing stations in a substrate processing system (e.g., a substrate processing system configured to perform deposition processes comprising, but not limited to, chemical vapor deposition (CVD), plasma enhanced CVD (PECVD), and thermal atomic layer deposition (ALD)). The valve inlet block typically comprises individual valves in respective tube weldments and/or one or more combined valves (e.g., an outlet/divert valve (ODV)). Heaters (e.g., molded-on and/or separable wrap heaters) may be provided on respective weldments and tubes to control flow and temperature of gas and vapor distribution to multiple processing stations.

This arrangement of the valve inlet block results in complex geometry having thermal load mismatching and various hot spots and cold spots. The hot spots may cause flow mismatch between branches of the gas distribution system and/or decomposition of sensitive precursors. Conversely, cold spots may cause flow mismatch and/or condensation. The valve inlet block may comprise multiple heater control zones (i.e., separately controllable heater zones) to compensate for the thermal load mismatch. The heater control zones and respective heaters correspond to potential failure points of the valve inlet block. Further, fittings and connections may be difficult to access for installation and service due to the complex geometry of the valve inlet block. In some examples, components of the valve inlet block may lack structural support (i.e., the components may be self-supporting) and are susceptible to misalignment.

A layered gas distribution arrangement according to the present disclosure comprises two or more valve inlet blocks and respective gas distribution components that improve thermal uniformity, modularity, cost, serviceability, and durability. Further, the arrangement of valve inlet blocks enables the use of a greater number of chemistry combinations (i.e., gas combinations) in the processing chamber. For example, valve tube weldments are combined within a single valve inlet block to simplify plumbing geometry and allow the entire distribution manifold to be heated by a single heater (e.g., a hybrid clamshell/oven heater). Heating each valve inlet block with a single heater significantly improves thermal uniformity (e.g., from +/−10° C. to +/−2° C.) and reduces hot and cold spots.

Figure 1:
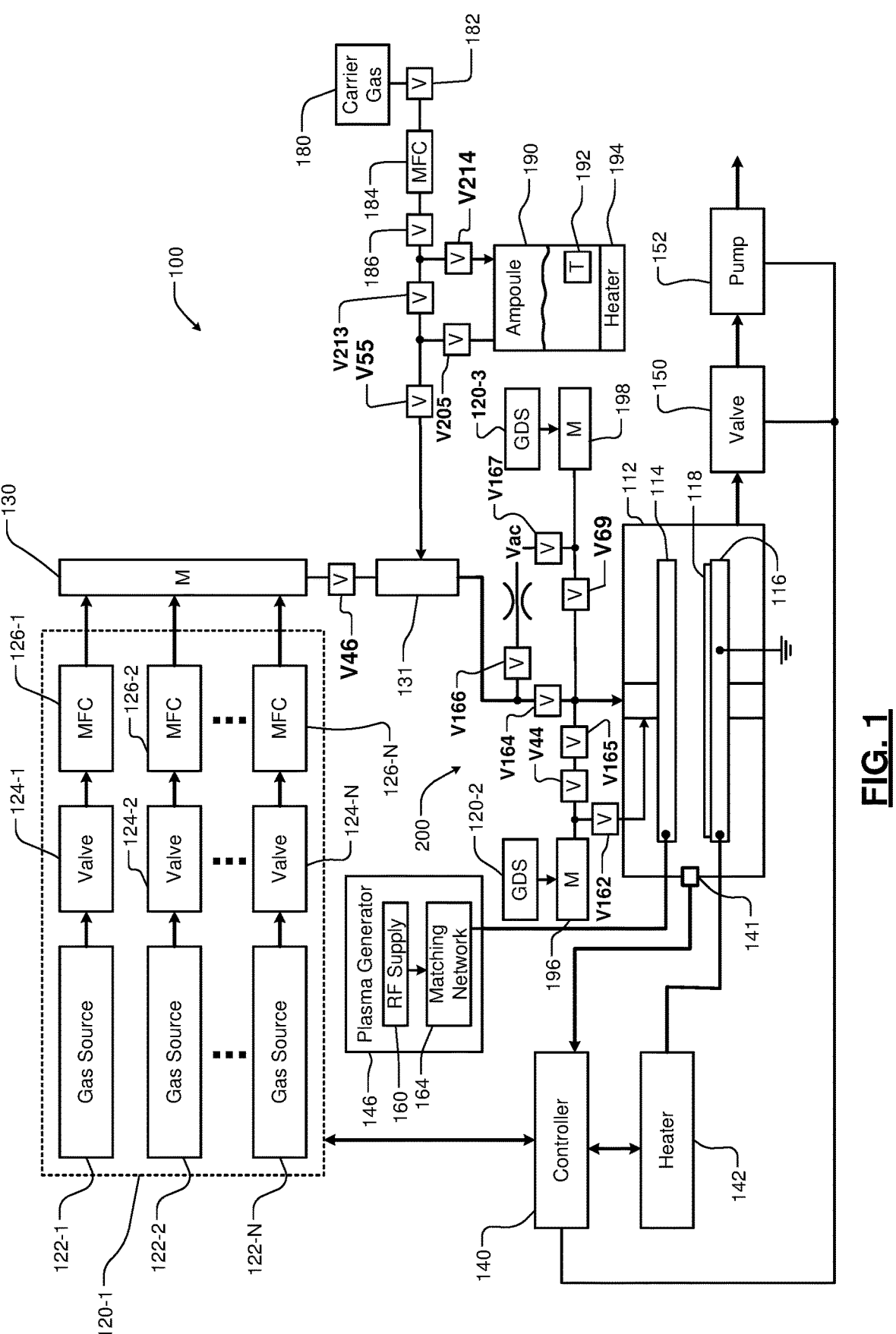
FIG. 1 is a functional block diagram of an example of a substrate processing system according to the present disclosure.

Referring now to FIG. 1, an example substrate processing system 100 comprises a processing chamber 112 with a reaction volume. In some examples, the substrate processing system 100 is configured to perform a plasma-enhanced chemical vapor deposition (CVD) or plasma enhanced atomic layer deposition (ALD) process. Process gas mixtures may be supplied to the processing chamber 112 using a gas distribution device 114 such as a showerhead. In some examples, the showerhead is a chandelier-type showerhead. A substrate 118 such as a semiconductor wafer may be arranged on a substrate support 116 during processing. The substrate support 116 may comprise a pedestal, an electrostatic chuck, a mechanical chuck or other type of substrate support.

One or more gas delivery systems (GDS) 120-1, 120-2, and 120-3 may each comprise one or more gas sources 122-2, 122-2, . . . , and 122-N (collectively gas sources 122), where N is an integer greater than one. Valves 124-1, 124-2, . . . , and 124-N (collectively valves 124), mass flow controllers 126-1, 126-2, . . . , and 126-N (collectively mass flow controllers 126), or other flow control devices may be used to supply one or more gases to a manifold 130, which supplies a gas mixture via a valve V46, a manifold 131, and a valve V164 to the processing chamber 112. In some examples, the manifold 131 is a heated injector manifold. One or more additional gas delivery systems may be provided to supply gases or gas mixtures in other locations. A divert path comprising a valve V166 selectively diverts gas to vacuum or exhaust.

A controller 140 may be used to monitor process parameters such as temperature, pressure, etc. (using one or more sensors 141) and to control process timing. The controller 140 may be used to control process devices such as gas delivery systems 120-1, 120-2 and 120-3, a substrate support heater 142, and/or an RF plasma generator 146. The controller 140 may also be used to evacuate the processing chamber 112 using a valve 150 and pump 152.

The RF plasma generator 146 generates the RF plasma in the processing chamber. The RF plasma generator 146 may be an inductive or capacitive-type RF plasma generator. In some examples, the RF plasma generator 146 may comprise an RF supply 160 and a matching and distribution network 162. While the RF plasma generator 146 is shown connected to the gas distribution device 114 and the substrate support is grounded or floating, the RF plasma generator 146 can be connected to the substrate support 116 and the gas distribution device 114 can be grounded or floating.

Vaporized precursor can be supplied to the manifold 131 by an ampoule 190 that supplies vaporized liquid precursor. A carrier gas 180 is supplied via valve 182, MFC 184, and valve 186. Additional valves V213, V205, V214, and V55 control delivery of the carrier gas and/or delivery of the carrier gas and vaporized precursor from the ampoule 190. In some examples, the ampoule 190 is heated by a heater 194. The ampoule 190 may further comprise one or more temperature sensors 192 to detect a temperature of the precursor liquid in the ampoule 190. The controller 140 may be used to sense the temperature of the precursor liquid and to control the heater 194 to heat the precursor liquid to a desired temperature.

When valve V213 is closed and valves V205 and V214 are open, carrier gas flows through the ampoule 190 and entrains vaporized precursor. The mixture of carrier gas and vaporized precursor is delivered by valve V55 to the manifold 131 and by the valve V164 to the gas distribution device 114. In some examples, the gas delivery system 120-2 delivers a gas mixture to a manifold 196 and valves V44 and V165 control delivery of the gases to the processing chamber. In some examples, a valve V162 provides a secondary purge gas mixture to the stem of the showerhead. In some examples, the gas delivery system 120-3 delivers gases to a manifold 198 and valves V69 and V167 control delivery of the gases to vacuum, exhaust or the processing chamber.

Figures 2A, 2B:
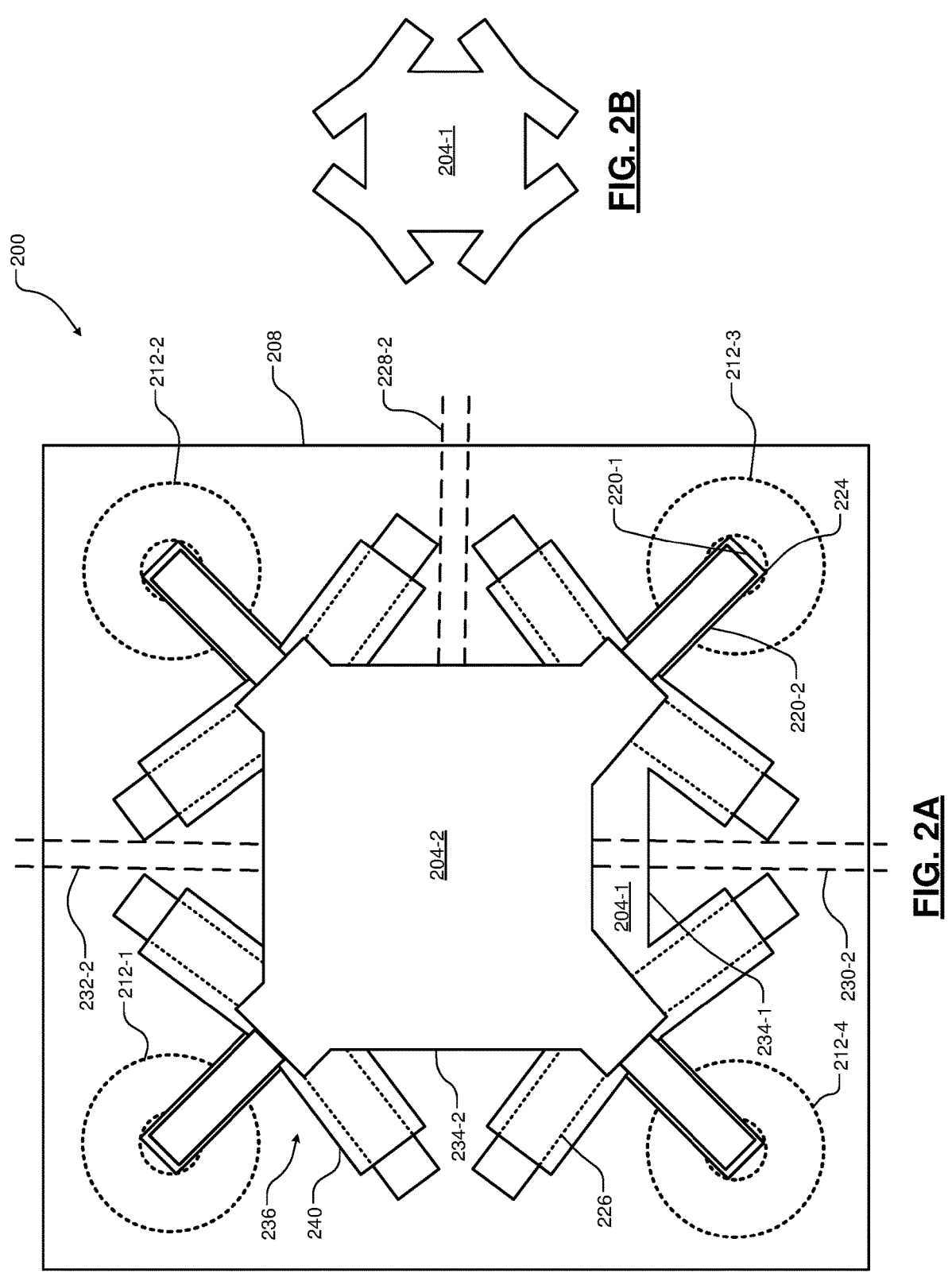
FIG. 2A is a plan view of an example gas distribution arrangement according to the present disclosure.
FIG. 2B is a plan view of an example valve inlet block according to the present disclosure.
Figure 2C:
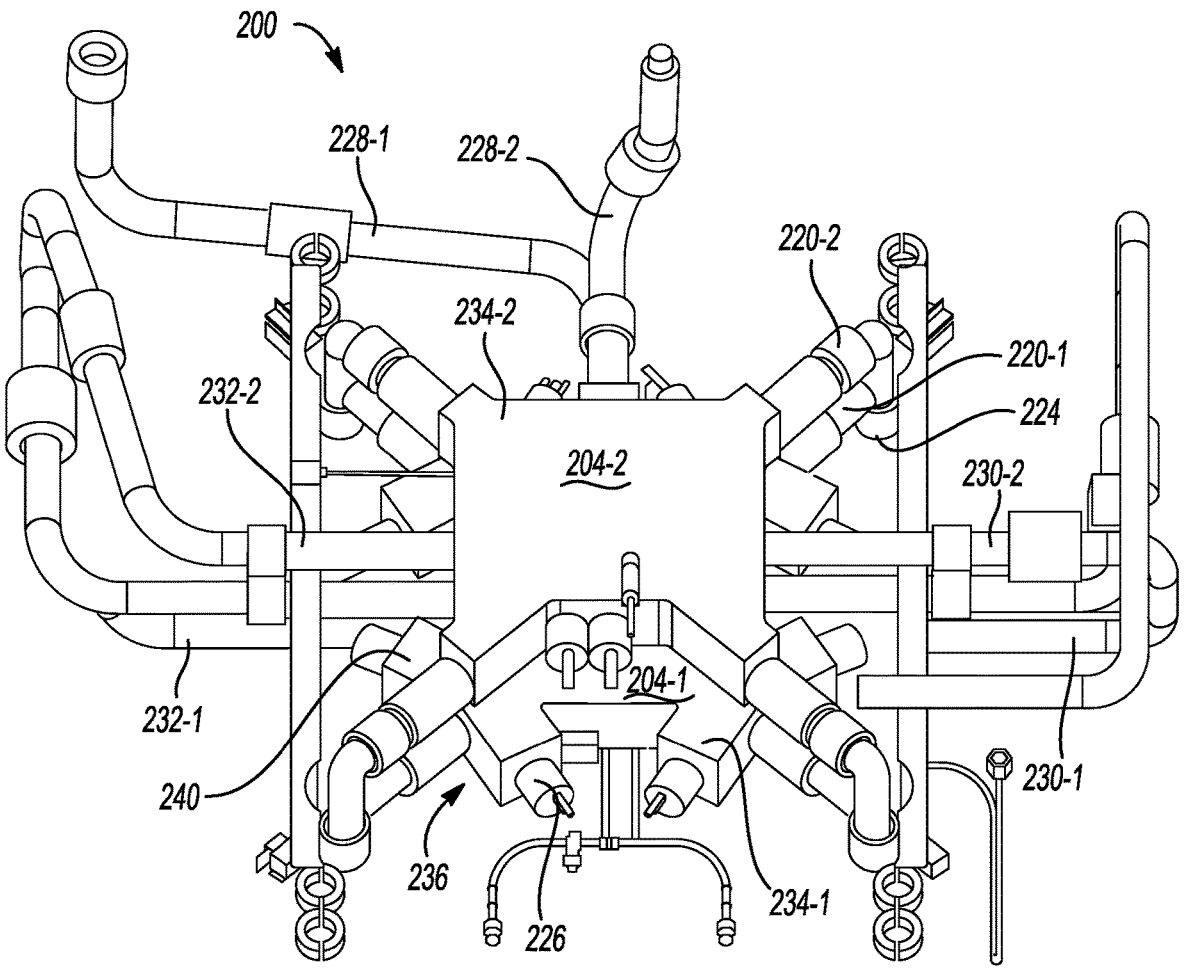
FIG. 2C is an isometric view of an example gas distribution arrangement according to the present disclosure.

Referring now to FIGS. 2A, 2B, 2C, and 2D, an example layered gas distribution arrangement 200 according to the present disclose comprises two or more generally rectangular valve inlet blocks 204 (e.g., four valve inlet blocks 204-1, 204-2, 204-3, and 204-4) arranged in respective layers. FIG. 2A is a plan view of the gas distribution arrangement 200 comprising two of the valve inlet blocks 204-1 and 204-2. FIG. 2B is an unobstructed plan view of the valve inlet block 204-1. FIG. 2C is an isometric view of the gas distribution arrangement 200 comprising the valve inlet blocks 204-1 and 204-2. FIG. 2D is a side view of an example of the gas distribution arrangement 200 comprising the four valve inlet blocks 204-1, 204-2, 204-3, and 204-4. Various valves, manifolds, and associated plumbing (e.g., tubing, weldments, etc.) described in FIG. 1 may be collectively referred to as and arranged within the inlet blocks 204 as described below in more detail.

The valve inlet blocks 204 are arranged above a substrate processing tool 208 and are configured to supply various gases and gas mixtures to respective processing stations (e.g., as indicated at 212-1, 212-2, 212-3, and 212-4, referred to collectively as processing stations 212. For example, the processing stations 212 may correspond to different processing chambers, different processing stations within a processing chamber, etc., and each comprise a respective showerhead 216 in fluid communication with one or more of the valve inlet blocks 204.

As shown in FIG. 2A, each of the valve inlet blocks 204-1 and 204-2 is configured to supply the gas mixtures to all of the processing stations 212. For example, the valve inlet block 204-1 comprises distribution outlets 220-1 and the valve inlet block 204-2 comprises distribution outlets 220-2 (referred to collectively as distribution outlets 220). Ends of the distribution outlets 220-1 are in fluid communication with respective ends of the distribution outlets 220-2 and respective inlets 224 of the processing stations 212. Accordingly, the valve inlet block 204-1 is configured to supply a first gas mixture (e.g., a first precursor gas mixture) to the processing stations 212 and the valve inlet block 204-2 is configured to supply a second gas mixture (e.g., a second precursor gas mixture) to the processing stations 212 via the same inlets 224.

The valve inlet block 204-1 comprises outlet/divert valves (ODVs) 226. The ODVs 226 receive the first precursor gas or gas mixture via a first precursor gas inlet 228-1 (not shown in FIG. 2A) and a co-flow gas or gas mixture via a first co-flow gas inlet 230-1 (not shown in FIG. 2A) and respective inlet distribution manifolds (not shown in FIGS. 2A, 2B, and 2C). Conversely, the valve inlet block 204-1 receives a second precursor gas or gas mixture via a second precursor gas inlet 228-2 and a co-flow gas or gas mixture via a second co-flow gas inlet 230-2. Gas mixtures may be selectively diverted from the valve inlet block 204-1 and the valve inlet block 204-2 via first divert outlet 232-1 (not shown in FIG. 2A) and second divert outlet 232-2, respectively.

The ODVs 226 selectively combine the first precursor gas and the co-flow gas and supply the resulting gas mixture to the respective distribution outlets 220-2 via an outlet distribution manifold (not shown in FIGS. 2A, 2B, 2C, and 2D). The ODVs 226 selectively divert the gas mixture from the valve inlet block 204-1 via a divert outlet manifold (not shown in FIGS. 2A, 2B, 2C, and 2D) and the divert outlet 232-1 (not shown in FIG. 2A).

Each of the valve inlet blocks 204-1 and 204-2 comprises a respective shell or housing 234-1 and 234-2 configured to enclose and heat the respective manifolds as described below (in FIG. 3A) in more detail. As shown in FIG. 2A, respective corners 236 of the valve inlet block 204-1 (i.e., corners of the housing 234) are configured to enclose the ODVs 226. For example, each of the corners 236 comprises legs 240 that extend outward from the housing 234 to form a "V" shape (e.g., a "V" shape defining an obtuse angle facing outward from the housing 234). The ODVs 226 enclosed within the legs 240 are also V-shaped.

As described above, in the layered gas distribution arrangement 200 according to the present disclosure, each of the valve inlet blocks 204 is arranged in a respective layer (e.g., in vertically stacked layers). Each of the layers (e.g., each of the valve inlet blocks 204) may have a height of less than 3.0" (76.2 mm). Further, each of the valve inlet blocks 204 comprises respective manifolds, gas inlets, and outlets configured to provide a different gas mixture to the processing stations 208. In other words, the valve inlet block 204-1 is configured to provide a first gas mixture to each of the processing stations 208, the valve inlet block 204-2 is configured to provide a first gas mixture to each of the processing stations 208, etc. Only two of the valve inlet blocks 204 may be provided to supply two different gas mixtures, or 3, 4, or more of the valve inlet blocks 204 may be provided in the same layered, vertical stack to supply additional gas mixtures.

Further, each of the precursor gas inlets 228 is arranged from a same (first) side of the arrangement 200. Similarly, each of the co-flow gas inlets 230 is arranged on a same (second) side of the arrangement 200 and each the divert outlets 232 is arranged on a same (third) side of the arrangement 200. As shown in FIG. 2D, each of the valve inlet blocks 204 is arranged in vertically stacked layers occupying a same footprint (e.g., as indicated by dashed lines 244 in FIG. 2D) as others of the valve inlet blocks 204. Respective tubing (i.e., inlets, outlets, manifolds, etc.) of each of the valve inlet blocks 204 does not pass between layers within the footprint 244. In other words, within the footprint 244, tubing corresponding to the valve inlet block 204-1 does not extend into gaps 248 between the valve inlet block 204-1 and the valve inlet block 204-2 and between the valve inlet block 204-1 and the valve inlet block 204-4. Similarly, within the footprint 244, tubing corresponding to the valve inlet block 204-2 does not extend into gaps 248 between the valve inlet block 204-2 and the valve inlet block 204-1 and between the valve inlet block 204-2 and the valve inlet block 204-3.

Accordingly, routing and installation of the respective gases to and from the valve inlet blocks 204 is simplified, and tubing and manifolds corresponding to each of the different gas mixtures to be supplied to the processing stations 208 can be enclosed within a respective one of the valve inlet blocks 204. Each of the valve inlet blocks 204 may also be separately and independently heated such that heating of each of the different gas mixtures is optimized.

Figure 3A:
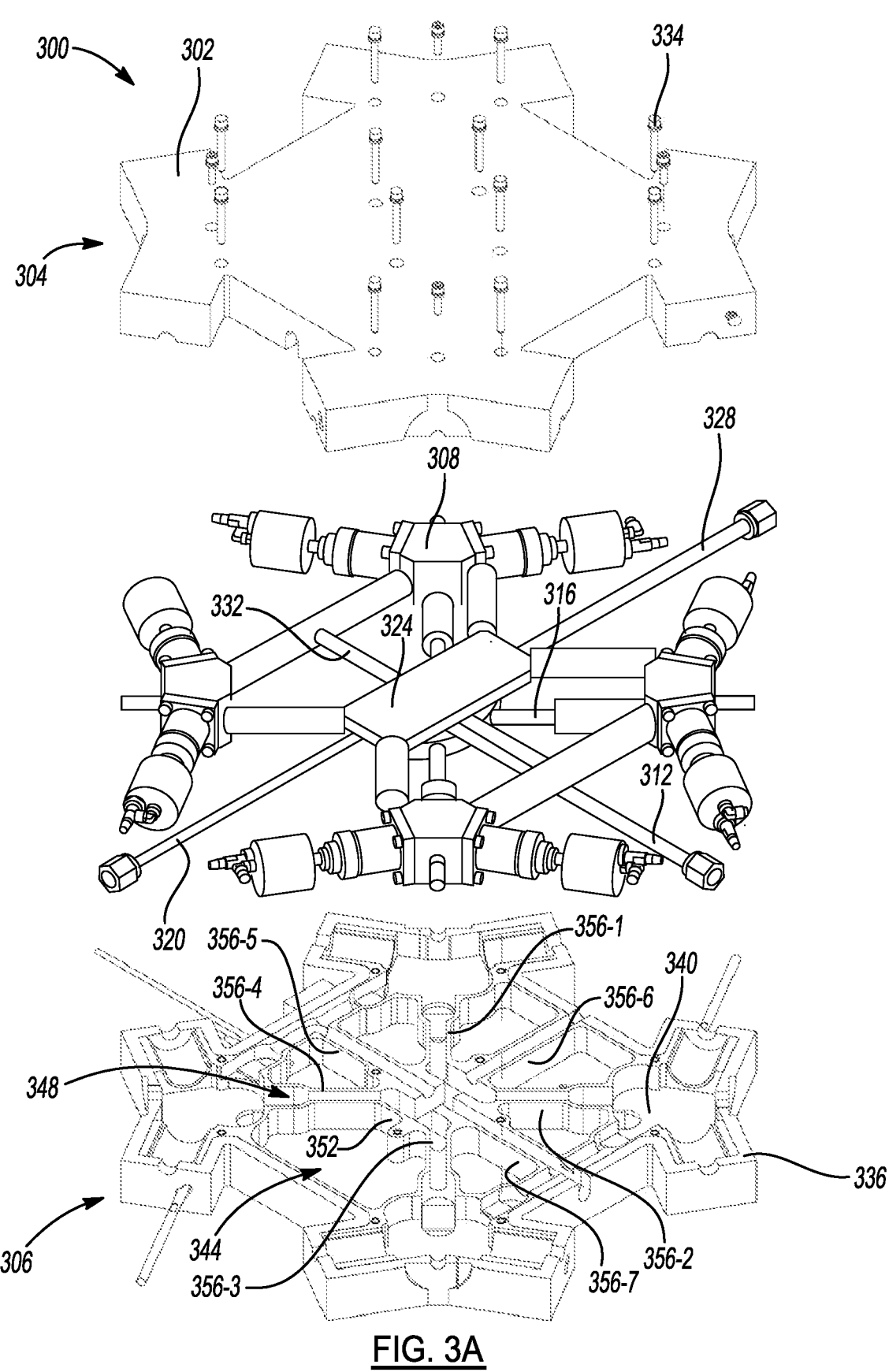
FIG. 3A is an exploded view of an example valve inlet block according to the present disclosure.

Referring now to FIG. 3A, an exploded view of an example valve inlet block 300 according to the present disclosure is shown. For example, the valve inlet block 300 corresponds to the valve inlet block 204-1. The valve inlet block 300 comprises a shell or housing 302 comprising a top portion 304 and a bottom portion 306 configured to enclose ODVs 308, a precursor gas inlet 312 and precursor gas manifold 316, a co-flow gas inlet 320 and co-flow gas manifold 324, and a divert outlet 328 and divert outlet manifold 332. For example only, the top portion 304 and the bottom portion 306 are coupled together using fasteners 334 (e.g., screws or bolts).

As described above in FIG. 2A, the respective corners of the housing 302 comprises legs 336 that extend outward to form a "V" shape configured to enclose the ODVs 308 (e.g., within valve cavities 340), which are also V-shaped. The legs 336 define cutouts or pockets 338 in the housing 302. The pockets 338 reduce an overall footprint and weight of the housing 302. The housing 302 defines a central cavity 344 and a plurality of channels 348 within the central cavity 344. The channels 348 in the bottom portion 306 of the housing 302 comprise a central hub 352 and a plurality of (e.g., seven) spokes or arms 356 extending radially outward from the central hub 352 toward the ODVs 308.

Four of the arms (356-1, 356-2, 356-3, and 356-4) form an "X" and extend from the central hub 352 toward the corners of the housing 302 and the respective ODVs. The arms 356-1, 356-2, 356-3, and 356-4 are configured to enclose respective portions of the precursor gas manifold 316. Three of the arms (356-5, 356-6, and 356-7) form a "T" and extend from the central hub 352 toward respective sides of the housing 302. Accordingly, the arms 356-5, 356-6, and 356-7 are configured to enclose the precursor gas inlet 312, the divert outlet 328, and portions of the divert outlet manifold 332. Similarly, the channels 348 in the top portion 304 (not shown) are configured to enclose the co-flow gas inlet 320 and the co-flow gas manifold 324.

Accordingly, the ODVs 308, the precursor gas inlet 312 and the precursor gas manifold 316, the co-flow gas inlet 320 and the co-flow gas manifold 324, and the divert outlet 328 and the divert outlet manifold 332 do not simply pass through the central cavity 344 and instead are enclosed within the channels 348. In this manner, associated plumbing components (e.g., tubing, couplings, weldments, etc.) are structurally supported within the housing 302.

Figures 3B, 4:
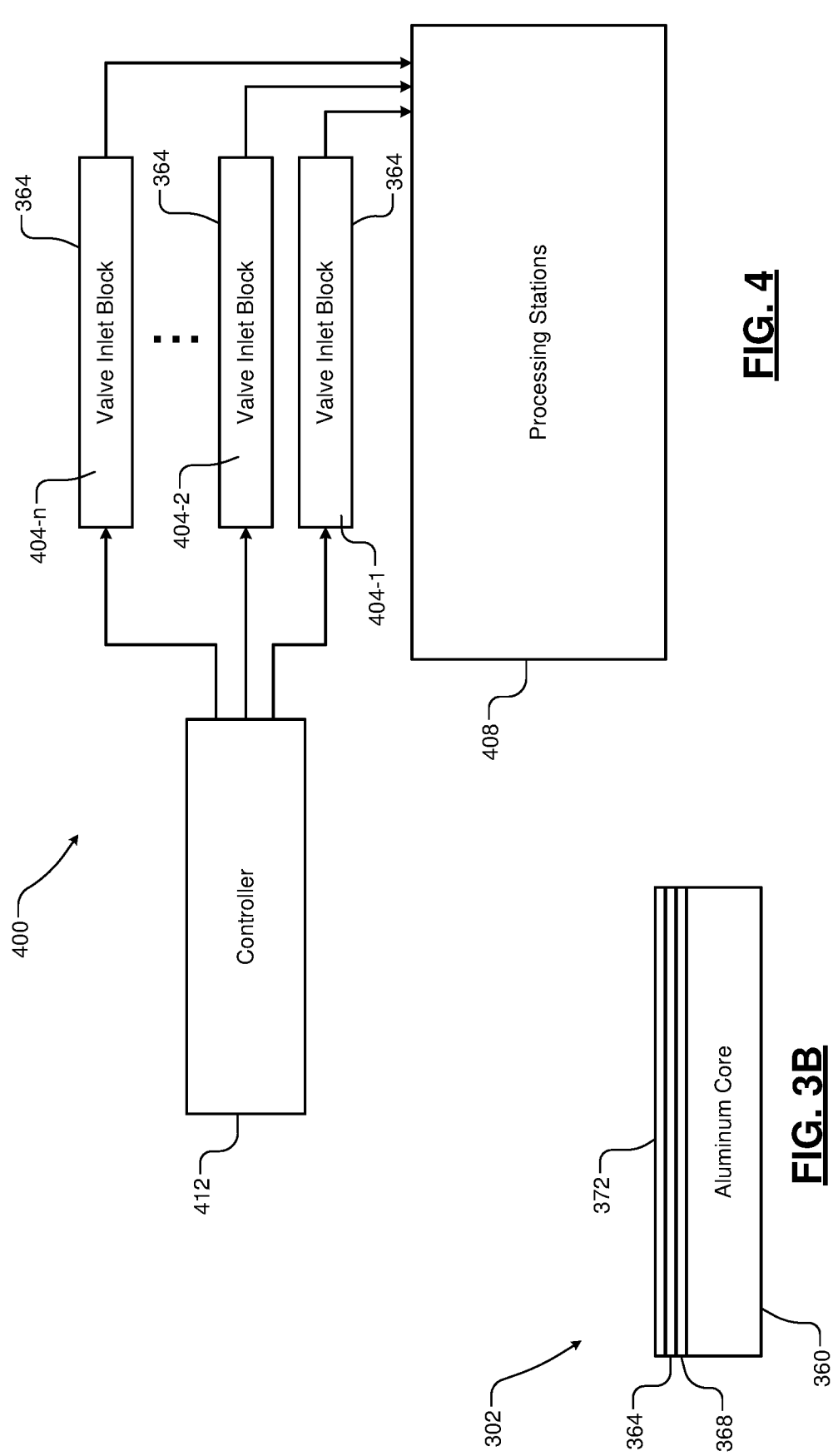
FIG. 3B shows a cross-section of a housing of the valve inlet block of FIG. 3A in more detail.
FIG. 4 is a functional block diagram of an example substrate processing system comprising a plurality of valve inlet blocks according to the present disclosure.

The housing 302 is further configured to function as a shell heater. For example, as shown in FIG. 3B, the housing 302 comprises a thermally conductive metal (e.g., aluminum) core 360 and a heater film 364 is bonded to an outer surface of the core 360. For example, the heater film 364 is a sheet or mat comprising heater wiring (e.g., a wiring mesh) that is bonded to the core 360 (e.g., using a thermally conductive silicone 368). A thermally and electrically insulative coating (e.g., silicone foam insulation) 372 is provided around the housing 302 to enclose the heater film 364.

Heat from the core 360 is conducted to respective portions of the ODVs 308, the precursor gas inlet 312 and the precursor gas manifold 316, the co-flow gas inlet 320 and the co-flow gas manifold 324, and the divert outlet 328 and the divert outlet manifold 332. In some examples, a thermally conductive material (e.g., thermal tape) may be provided around selective portions of the ODVs 308, the precursor gas inlet 312 and the precursor gas manifold 316, the co-flow gas inlet 320 and the co-flow gas manifold 324, and the divert outlet 328 and the divert outlet manifold 332 to facilitate thermal conduction from the housing 302. In this manner, gas mixtures supplied by the valve inlet block 300 can be maintained at consistent desired temperatures.

Referring now to FIG. 4 and with continued reference to FIGS. 3A and 3B, an example substrate processing system 400 according to the present disclosure comprises a plurality of valve inlet blocks 404-1, 404-2, . . . , and 404-*n* (referred to collectively as valve inlet blocks 404) configured to provide different precursor gas mixtures to processing stations 408 as described above. A controller 412 is configured to separately and independently control respective temperatures of the valve inlet blocks 404. For example, the controller 412 controls supply of electrical signals to heater films (e.g., corresponding to the heater films 364) of the valve inlet blocks 404. Accordingly, each of the valve inlet blocks 404 can be maintained at a different temperature in accordance with desired temperatures of the respective precursor gas mixtures.

In some examples, the heater films 364 of each of the valve inlet blocks 404 corresponds to a single heater zone. In other words, the controller 412 provides single respective control signal to each of the heater films 364 to control the temperature of the entire valve inlet block 404. In other examples, the heater films 364 comprise a plurality of heater zones (e.g., quadrants) each configured to receive a separate control signal from the controller 412. In these examples, the controller 412 is configured to separately control temperatures of different heater zones of each of the valve inlet blocks. In still other examples, additional separately controllable heating elements (e.g., cartridge heaters) may be arranged in selected portions of the valve inlet blocks 404 to provide additional temperature control tuning.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, such as "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, such as the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may comprise chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may comprise a local network or the Internet. The remote computer may comprise a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may comprise a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas distribution arrangement to provide gas mixtures to a plurality of processing stations in a substrate processing system, the gas distribution arrangement comprising:

a first valve inlet block to supply a first precursor gas mixture to each of the plurality of processing stations, wherein the first valve inlet block is arranged in a first vertical layer above the plurality of processing stations, and wherein the first valve inlet block comprises a first housing that encloses (i) a first plurality of valves in fluid communication with respective ones of the plurality of processing stations, (ii) a first precursor gas manifold in fluid communication with each of the first plurality of valves, (iii) a first co-flow gas manifold in fluid communication with each of the first plurality of valves, and (iv) a first divert outlet manifold in fluid communication with each of the first plurality of valves; and a second valve inlet block to supply a second precursor gas mixture to each of the plurality of processing stations, wherein the second valve inlet block is arranged in a second vertical layer above the first valve inlet block, and wherein the second valve inlet block comprises a second housing that encloses (i) a second plurality of valves in fluid communication with respective ones of the plurality of processing stations, (ii) a second precursor gas manifold in fluid communication with each of the second plurality of valves, (iii) a second co-flow gas manifold in fluid communication with each of the second plurality of valves, and (iv) a second divert outlet manifold in fluid communication with each of the second plurality of valves.

2. The gas distribution arrangement of claim 1, wherein at least one of the first plurality of valves and the second plurality of valves comprises outlet/divert valves.

3. The gas distribution arrangement of claim 1, further comprising a third valve inlet block arranged in a third vertical layer above the second valve inlet block.

4. The gas distribution arrangement of claim 1, wherein the first housing of the first valve inlet block comprises a top portion and a bottom portion that defines a central cavity and a plurality of channels within the central cavity, wherein the plurality of channels are arranged to enclose respective portions of each of the first plurality of valves, the first precursor gas manifold, the first co-flow gas manifold, and the first divert outlet manifold.

5. The gas distribution arrangement of claim 4, wherein the plurality of channels comprises a central hub and a plurality of arms that extends radially outward from the central hub.

6. The gas distribution arrangement of claim 5, wherein the plurality of arms comprises a first arm, a second arm, a third arm, and a fourth arm arranged in an "X" shape.

7. The gas distribution arrangement of claim 6, wherein the first arm, the second arm, the third arm, and the fourth arm enclose the first precursor gas manifold.

8. The gas distribution arrangement of claim 7, wherein the plurality of arms comprise a fifth arm, a sixth arm, and a seventh arm arranged in a "T" shape.

9. The gas distribution arrangement of claim 8, wherein the fifth arm, the sixth arm, and the seventh arm enclose the first divert outlet manifold.

10. The gas distribution arrangement of claim 9, further comprising a first precursor gas inlet in fluid communication with the first precursor gas manifold and a first divert outlet in fluid communication with the first divert outlet manifold, wherein one of the fifth arm, the sixth arm, and the seventh arm encloses the first precursor gas inlet and another of the fifth arm, the sixth arm, and the seventh arm encloses the first divert outlet.

11. The gas distribution arrangement of claim 10, further comprising a first co-flow gas inlet in fluid communication with the first co-flow gas manifold, wherein the top portion encloses the first co-flow gas inlet and the first co-flow gas manifold.

12. The gas distribution arrangement of claim 1, wherein each corner of the first valve inlet block comprises legs that extend outward from the first housing to form a "V" shape, and wherein the legs define valve cavities to enclose the first plurality of valves.

13. The gas distribution arrangement of claim 1, wherein each of the first valve inlet block and the second valve inlet block comprises a thermally conductive metal core.

14. The gas distribution arrangement of claim 13, wherein the core comprises aluminum.

15. The gas distribution arrangement of claim 13, wherein the metal core comprises a heater film bonded to an outer surface of the metal core.

16. The gas distribution arrangement of claim 15, wherein the heater film is bonded to the outer surface of the metal core using a thermal adhesive.

17. A system comprising the gas distribution arrangement of claim 15 and further comprising a controller configured to control supply of respective electrical signals to the heater films of the first valve inlet block and the second valve inlet block to separately control temperatures of the first valve inlet block and the second valve inlet block.

18. The system of claim 17, wherein each of the heater films comprises a plurality of heater zones.

19. The gas distribution arrangement of claim 1, wherein each of the first valve inlet block and the second valve inlet block has a height of less than 76.2 mm.

* * * * *